United States Patent
Yu et al.

(10) Patent No.: US 6,764,959 B2
(45) Date of Patent: Jul. 20, 2004

(54) THERMAL COMPENSATION METHOD FOR FORMING SEMICONDUCTOR INTEGRATED CIRCUIT MICROELECTRONIC FABRICATION

(75) Inventors: Mo-Chiun Yu, Taipei (TW); Shih-Chang Chen, Taynan (TW); Chen-Hua Yu, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/920,911

(22) Filed: Aug. 2, 2001

(65) Prior Publication Data

US 2003/0027391 A1 Feb. 6, 2003

(51) Int. Cl.⁷ ................................................ H01L 21/00
(52) U.S. Cl. ......................................... 438/762; 438/981
(58) Field of Search ................................ 438/981, 762, 438/763

(56) References Cited

U.S. PATENT DOCUMENTS

| 5,576,573 | A | * | 11/1996 | Su et al. ...................... 257/391 |
| 5,672,521 | A | | 9/1997 | Barsan et al. |
| 6,054,374 | A | * | 4/2000 | Gardner et al. ............. 438/528 |
| 6,147,008 | A | | 11/2000 | Chwa et al. |
| 6,235,591 | B1 | | 5/2001 | Balasubramanian et al. |
| 6,303,521 | B1 | * | 10/2001 | Jenq ........................... 438/770 |
| 6,358,865 | B2 | * | 3/2002 | Pearce et al. ............... 438/763 |
| 6,399,448 | B1 | * | 6/2002 | Mukhopadhyay et al. .. 438/275 |

\* cited by examiner

Primary Examiner—Richard A. Booth
(74) Attorney, Agent, or Firm—Tung & Associates

(57) ABSTRACT

Within a sequential and repetitive thermal oxidation and stripping method for forming a plurality of gate dielectric layers having a maximum numbered plurality of thicknesses upon a semiconductor substrate, there is provided a compensating thermal annealing when forming less than the maximum numbered plurality of thicknesses of the plurality of gate dielectric layers upon the semiconductor substrate. By employing the compensating thermal annealing, the semiconductor substrate is more readily manufacturable in conjunction with related microelectronic fabrications.

19 Claims, 2 Drawing Sheets

THERMAL COMPENSATION METHOD FOR FORMING SEMICONDUCTOR INTEGRATED CIRCUIT MICROELECTRONIC FABRICATION

BACKGROUND OF THE INVENTION

1. Field of the Invention

The present invention relates generally to methods for forming gate dielectric layers within semiconductor integrated circuit microelectronic fabrications. More particularly, the present invention relates to methods for forming multiple gate dielectric layers with multiple thicknesses within semiconductor integrated circuit microelectronic fabrications.

2. Description of the Related Art

Semiconductor integrated circuit microelectronic fabrications are formed from semiconductor substrates over which are formed patterned conductor layers which are separated by dielectric layers.

As semiconductor integrated circuit microelectronic fabrication integration levels have increased and semiconductor integrated circuit microelectronic fabrication functionality levels have increased, it has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses. Within the context of the present invention, gate dielectric layers are intended as dielectric layers which are formed directly upon silicon semiconductor substrates, whether or not they are employed within field effect transistor (FET) devices, although gate dielectric layers are most typically employed within field effect transistor (FET) devices within semiconductor integrated circuit microelectronic fabrications. Similarly, although gate dielectric layers within semiconductor integrated circuit microelectronic fabrications are most commonly formed employing thermal oxidation methods, gate dielectric layers within semiconductor integrated circuit microelectronic fabrications may also be formed employing various combinations of thermal oxidation methods, deposition methods and nitridation methods.

It has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses insofar as the functional requirements and operational requirements of the pluralities of semiconductor devices formed within the semiconductor integrated circuit microelectronic fabrications often demand the plurality of gate dielectric layers having the plurality of gate dielectric layer thicknesses. For example and without limitation, within embedded semiconductor integrated circuit microelectronic fabrications (i.e., semiconductor integrated circuit microelectronic fabrications which perform both a logic function and a memory function), it is common to employ comparatively thin gate dielectric layers within field effect transistor (FET) devices which perform the logic function, such as to enhance operating speed of the field effect transistor (FET) devices which perform the logic function, while employing comparatively thick gate dielectric layers within field effect transistor (FET) devices which perform memory functions or other peripheral functions, wherein the field effect transistor (FET) devices which perform the memory function or other peripheral function are subject to comparatively high operating voltages.

While it is thus desirable in the art of semiconductor integrated circuit microelectronic fabrication to provide pluralities of semiconductor devices having corresponding pluralities of gate dielectric layers in turn having corresponding pluralities of gate dielectric layers thicknesses, and often unavoidable in the art of semiconductor integrated circuit microelectronic fabrication to provide pluralities of semiconductor devices having corresponding pluralities of gate dielectric layers in turn having corresponding pluralities of gate dielectric layer thicknesses, forming within semiconductor integrated circuit microelectronic fabrications such semiconductor devices having corresponding pluralities of gate dielectric layers in turn having corresponding pluralities of gate dielectric layer thicknesses is not entirely without problems in the art of semiconductor integrated circuit microelectronic fabrication.

In that regard, it is often difficult to form within semiconductor integrated circuit microelectronic fabrications pluralities of semiconductor devices having corresponding pluralities of gate dielectric layers in turn having corresponding pluralities of gate dielectric layer thicknesses with enhanced manufacturability of the semiconductor integrated circuit microelectronic fabrications.

It is thus desirable in the art of semiconductor integrated circuit microelectronic fabrication to form within semiconductor integrated circuit microelectronic fabrications pluralities of semiconductor devices having corresponding pluralities of gate dielectric layers in turn having corresponding pluralities of gate dielectric layers thicknesses, with enhanced manufacturability of the semiconductor integrated circuit microelectronic fabrications.

It is towards the foregoing object that the present invention is directed.

Various methods have been disclosed in the art of semiconductor integrated circuit microelectronic fabrication for forming, with corresponding pluralities of gate dielectric layers having corresponding pluralities of gate dielectric layer thicknesses, pluralities of semiconductor devices within semiconductor integrated circuit microelectronic fabrications.

Included among the methods, but not limiting among the methods, are methods disclosed within: (1) Barsan et al., in U.S. Pat. No. 5,672,521 (a method which employs implanting into a first region of a silicon semiconductor substrate a dose of a dopant which enhances thermal oxidation of the silicon semiconductor substrate and implanting into a second region of the silicon semiconductor substrate a dose of a nitrogen dopant which inhibits thermal oxidation of the silicon semiconductor substrate, such that upon thermal oxidation of the silicon semiconductor substrate including the first region, the second region and an unimplanted third region there is formed upon the silicon semiconductor substrate a gate dielectric layer having three thickness regions); (2) Chwa et al., in U.S. Pat. No. 6,147,008 (a method which employs implanting through a gate dielectric layer formed upon a silicon semiconductor substrate a dose of a nitrogen implanting ion which inhibits thermal oxidation of the silicon semiconductor substrate and then patterning the gate dielectric layer to form a patterned gate dielectric layer which leaves exposed implanted and unimplanted portions of the silicon semiconductor substrate, prior to thermally oxidizing the silicon semiconductor substrate to reform a gate dielectric layer having three thickness regions); and (3) Balasubramanian et al., in U.S. Pat. No. 6,235,591 (a sequential thermal annealing method for forming differential gate oxide layer thicknesses within semiconductor integrated circuit microelectronic fabrications with enhanced reliability by employing a bilayer sacrificial mask layer formed of other than a photoresist material).

Desirable in the art of semiconductor integrated circuit microelectronic fabrication are additional methods for forming within semiconductor integrated circuit microelectronic fabrications pluralities of semiconductor devices having corresponding pluralities of gate dielectric layers in turn having corresponding pluralities of gate dielectric layer thicknesses, with enhanced manufacturability of the semiconductor integrated circuit microelectronic fabrications.

It is towards the foregoing object that the present invention is directed.

SUMMARY OF THE INVENTION

A first object of the present invention is to provide a method for forming within a semiconductor integrated circuit microelectronic fabrication a plurality of semiconductor devices having a corresponding plurality of gate dielectric layers having a corresponding plurality of gate dielectric layer thicknesses.

A second object of the present invention is to provide a method in accord with the first object of the present invention, wherein the semiconductor integrated circuit microelectronic fabrication is formed with enhanced manufacturability.

A third object of the present invention is to provide a method in accord with the first object of the present invention and the second object of the present invention, wherein the method is readily commercially implemented.

In accord with the objects of the present invention, there is provided by the present invention a method for fabricating a semiconductor substrate. To practice the method of the present invention, there is first defined a sequential and repetitive thermal oxidation and partial stripping method for forming upon a semiconductor substrate a plurality of gate dielectric layers having a maximum numbered plurality of differing thicknesses formed employing a corresponding maximum numbered plurality of thermal oxidation process steps. There is then sequentially and repetitively thermally oxidized and partially stripped the semiconductor substrate to form thereupon the plurality of gate dielectric layers having less than the maximum numbered plurality of differing thicknesses formed employing less than the corresponding maximum numbered plurality of thermal oxidation process steps. Within the present invention, there is also supplementally thermally annealed the semiconductor substrate to compensate for forming thereupon the plurality of gate dielectric layers having less than the maximum numbered plurality of differing thicknesses formed employing less than the corresponding maximum numbered plurality of thermal oxidation process steps.

Within the present invention, after having fabricated the semiconductor substrate while supplementally thermally annealing the same to thermally compensate for having formed thereupon the plurality of gate dielectric layers having less than the maximum numbered plurality of differing thicknesses formed employing less that the corresponding maximum numbered plurality of thermal oxidation process steps, there may be formed within and upon the semiconductor substrate a series of microelectronic devices while employing the plurality of gate dielectric layers.

There is provided by the present invention a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced manufacturability.

The present invention realizes the foregoing object by first defining a sequential and repetitive thermal oxidation and partial stripping method for forming upon a semiconductor substrate a plurality of gate dielectric layers having a maximum numbered plurality of differing thicknesses formed employing a corresponding maximum numbered plurality of thermal oxidation process steps. Similarly, the present invention then provides for sequentially and repetitively thermally oxidizing and partially stripping the semiconductor substrate to form thereupon the plurality of gate dielectric layers, but having less than the maximum numbered plurality of differing thicknesses formed employing less than the corresponding maximum numbered plurality of thermal oxidation process steps. Finally, the present invention provides for supplementally thermally annealing the semiconductor substrate to compensate for forming thereupon the plurality of gate dielectric layers having less than the maximum numbered plurality of differing thicknesses formed employing less than the corresponding maximum numbered plurality of thermal oxidation process steps. Within the present invention, the supplemental thermal annealing provides the semiconductor substrate with a uniform aggregate thermal exposure such that, for example and without limitation, device performance within the semiconductor substrate may be uniformly effected and modeled independently of a number of thermal oxidation process steps to which the semiconductor substrate is exposed.

The method of the present invention is readily commercially implemented.

The present invention employs methods and materials as are otherwise generally conventional in the art of semiconductor integrated circuit microelectronic fabrication, but employed within the context of a specific process ordering and specific process limitations to provide the present invention. Since it is thus at least in part a specific process ordering and specific process limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
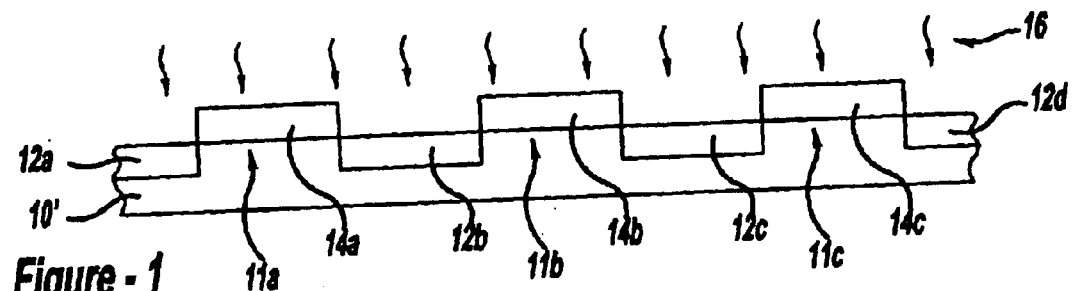
FIG. 1, FIG. 2, FIG. 3, FIG. 4 and FIG. 5 show a series of schematic cross-sectional diagrams illustrating the results of progressive stages in forming within a semiconductor integrated circuit microelectronic fabrication, and in accord with a generally conventional method, a series of gate dielectric layers.

The present invention provides a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced manufacturability.

The present invention realizes the foregoing object by first defining a sequential and repetitive thermal oxidation and partial stripping method for forming upon a semiconductor substrate a plurality of gate dielectric layers having a maximum numbered plurality of differing thicknesses formed employing a corresponding maximum numbered plurality of thermal oxidation process steps. Similarly, the present invention then provides for sequentially and repetitively thermally oxidizing and partially stripping the semiconductor substrate to form thereupon the plurality of gate dielectric layers, but having less than the maximum numbered plurality of differing thicknesses formed employing less than the corresponding maximum numbered plurality of thermal oxidation process steps. Finally, the present invention provides for supplementally thermally annealing the semiconductor substrate to compensate for forming thereupon the plurality of gate dielectric layers having less than the maximum numbered plurality of differing thicknesses formed employing less than the corresponding maximum numbered plurality of thermal oxidation process steps. Within the present invention, the supplemental thermal annealing provides the semiconductor substrate with a uniform aggregate thermal exposure such that, for example and without limitation, device performance within the semiconductor substrate may be uniformly effected and modeled independently of a number of thermal oxidation process steps to which the semiconductor substrate is exposed.

Although the preferred embodiment of the present invention illustrates the present within the context of forming within a semiconductor integrated circuit microelectronic fabrication three gate dielectric layers formed upon three active regions of a semiconductor substrate, the present invention is extendable to increased numbers of gate dielectric layers formed upon increased numbers of active regions of a semiconductor substrate.

Typically and preferably, the present invention is directed towards a method which provides a maximum numbered plurality of gate oxide layers of at least three, although a maximum numbered plurality of gate oxide layers of greater than three is also within the context of the present invention. Similarly, within the present invention with respect to thicknesses of gate oxide layers, such thicknesses typically and preferably range from a low thickness of from about 10 to about 40 angstroms to a high thickness of from about 50 to about 200 angstroms.

Referring now to FIG. 1 to FIG. 5, there is shown a series of schematic cross-sectional diagrams illustrating the results of progressive stages in forming within a semiconductor integrated microelectronic fabrication, and in accord with a generally conventional method, a series of gate dielectric layers. Within the schematic cross-sectional diagrams of FIG. 1 to FIG. 5, the process flow is generally conventional (in accord with disclosures of the Related Art references which are incorporated herein fully by reference), but the process parameters need not be conventional.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a once thermally oxidized semiconductor substrate 10' having formed therein a series of isolation regions 12a, 12b, 12c and 12d which define a series of active regions 11a, 11b and 11c of the once thermally oxidized semiconductor substrate 10'.

Within the preferred embodiment of the present invention with respect to the once thermally oxidized semiconductor substrate 10', and although semiconductor substrates are known in the art of semiconductor integrated circuit microelectronic fabrication with either dopant polarity, several dopant concentrations and various crystallographic orientations, for the preferred embodiment of the present invention, the once thermally oxidized semiconductor substrate 10' is typically and preferably an N– or P– silicon semiconductor substrate.

Within the preferred embodiment of the present invention with respect to the series of isolation regions 12a, 12b, 12c and 12d, and although it is also known in the art of semiconductor integrated circuit microelectronic fabrication that isolation regions may be formed employing methods including but not limited to isolation region thermal growth methods and isolation region deposition/patterning methods, either of which are applicable within the context of the present invention, for the preferred embodiment of the present invention, the series of isolation regions 12a, 12b, 12c and 12d is, as is illustrated within the schematic cross-sectional diagram of FIG. 1, typically and preferably formed as a series of shallow trench isolation (STI) regions. Within the preferred embodiment of the present invention, typically and preferably, each of the series of isolation regions 12a, 12b, 12c and 12d is formed of a linewidth of from about 01. to about 5 microns, while each of the active regions 11a, 11b and 11c of the once thermally oxidized semiconductor substrate 10' is formed of a linewidth of from about 0.1 to about 5 microns.

Finally, there is shown within the schematic cross-sectional diagram of FIG. 1 a series of first gate oxide layers 14a, 14b and 14c formed upon the active regions 11a, 11b and 11c of the once thermally oxidized semiconductor substrate 10' incident to thermal annealing within a first thermal oxidizing environment 16.

Within a generally conventional method as illustrated within the schematic cross-sectional diagram of FIG. 1, the first thermal oxidizing environment 16 is typically and preferably provided at a temperature of from about 600 to about 1000 degrees centigrade for a time period of from about 5 to about 120 minutes within an oxygen or steam first thermal oxidizing environment, to provide the series of first gate oxide layers 14a, 14b and 14c of thickness from about 30 to about 100 angstroms. To effect the foregoing conditions and results, either furnace annealing methods or rapid thermal annealing methods may be employed.

Figure 2:
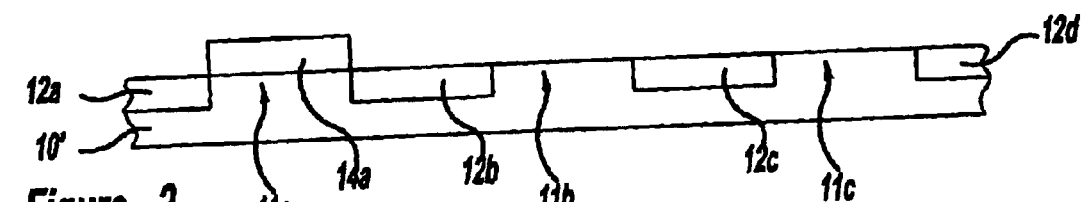

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the pair of first gate oxide layers 14b and 14c has been stripped from the pair of active regions 11b and 11c of the once thermally oxidized semiconductor substrate 10'.

The pair of first gate oxide layers 14b and 14c may be stripped from the pair of active regions 11b and 11c of the once thermally oxidized semiconductor substrate 10' while employing stripping methods and materials as are conventional in the art of semiconductor integrated circuit microelectronic fabrication, and while masking (as is otherwise not illustrated within the schematic cross-sectional diagram of FIG. 1) the first gate oxide layer 14a.

Figure 3:
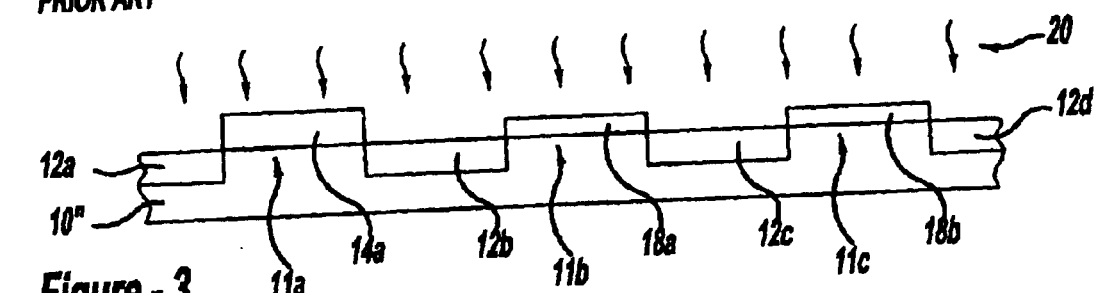

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed upon the active regions 11b and 11c of a twice thermally oxidized semiconductor substrate 10" a pair of second gate oxide layers 18a and 18b incident to thermal annealing the once thermally oxidized semiconductor substrate 10' within a second thermal oxidizing environment 20.

Within the conventional method as illustrated within the schematic cross-sectional diagram of FIG. 3, the second thermal oxidizing environment 20 is analogous to the first thermal oxidizing environment 16, but provided at a temperature of from about 600 to about 1000 degrees centigrade for a time period of from about 5 to about 60 minutes to provide the pair of second gate oxide layers 18a and 18b of thickness from about 15 to about 40 angstroms.

Figure 4:
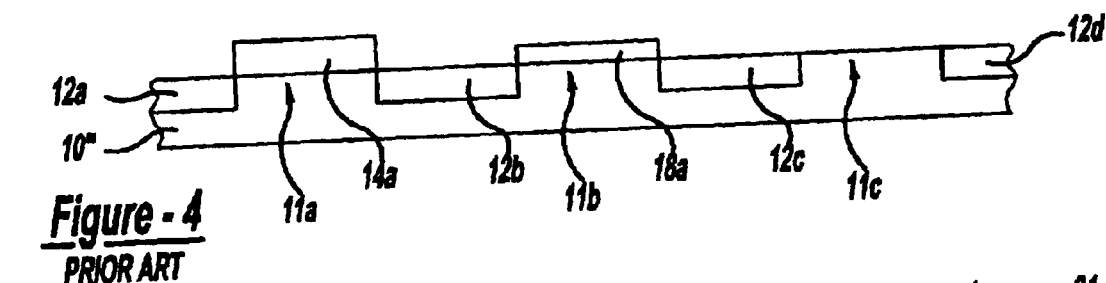

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there has been stripped from the active region 11c of the twice thermally oxidized semiconductor substrate 10" the second gate oxide layer 18b.

Analogously with the semiconductor integrated circuit microelectronic fabrication whose schematic cross-sectional diagram is illustrated in FIG. 2, the second gate oxide layer 18b may be stripped from the active region 11c of the twice thermally oxidized semiconductor substrate 10" while masking the first gate oxide layer 14a and the second gate oxide layer 18a.

Figure 5:
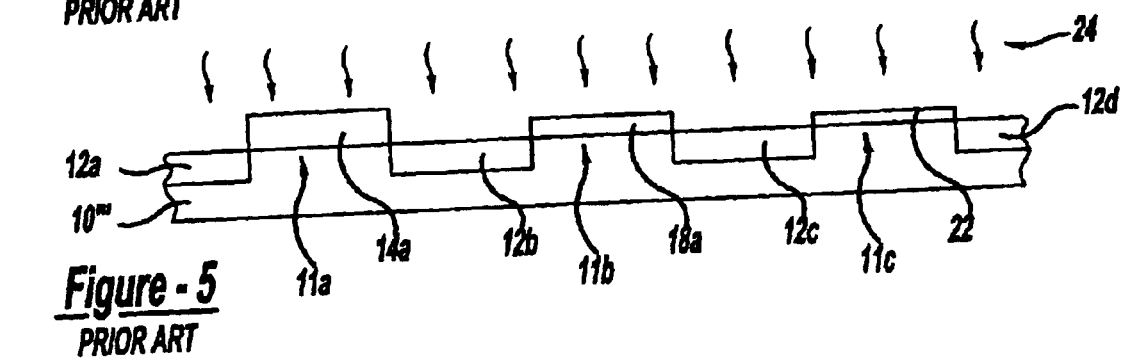

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been formed upon the active region 11c of a three times thermally oxidized semiconductor substrate 10'" a third gate oxide layer 22 incident to annealing within a third thermal oxidizing environment 24.

Within the semiconductor integrated circuit microelectronic fabrication whose schematic cross-sectional diagram is illustrated in FIG. 5, the third thermal oxidizing environment 24 is analogous to the first thermal oxidizing environment 16 and the second thermal oxidizing environment 20, but typically and preferably provided at a temperature of from about 600 to about 800 degrees centigrade for a time period of from about 0.5 to about 60 minutes to provide the third gate oxide layer 22 of thickness from about 10 to about 30 angstroms.

While the generally conventional method as outlined within the context of the schematic cross-sectional diagrams of FIG. 1 to FIG. 5 is acknowledged within the art of microelectronic fabrication for forming a semiconductor integrated circuit microelectronic fabrication having formed therein multiple gate oxide layers of differing thicknesses, the method as outlined within the context of the schematic cross-sectional diagrams of FIG. 1 to FIG. 5 is nonetheless not entirely without problems in the art of microelectronic fabrication.

In that regard, the method as outlined within the context of the schematic cross-sectional diagrams of FIG. 1 to FIG. 5 provides manufacturing inefficiencies when integrated with analogous methods which provide a semiconductor integrated circuit microelectronic fabrication having formed therein a plurality of gate oxide layers having less than a maximum number of different thicknesses (i.e., three) as illustrated within the schematic cross-sectional diagrams of FIG. 1 to FIG. 5. The manufacturing inefficiencies derive from a need to independently model and adjust parameters within the various microelectronic fabrications since they are formed employing differing levels of thermal exposures.

It is thus towards the goal of providing a method analogous to the method illustrated within the context of FIG. 1 to FIG. 5, while providing uniformity of microelectronic device operation independent of the number of thermal oxidation cycles, that the present invention is directed.

To realize the foregoing object, the present invention provides a method in accord with the schematic cross-sectional diagrams of FIG. 6 to FIG. 9, which in turn illustrate the results of forming a semiconductor integrated circuit microelectronic fabrication in accord with a preferred embodiment of the present invention.

Figure 6:
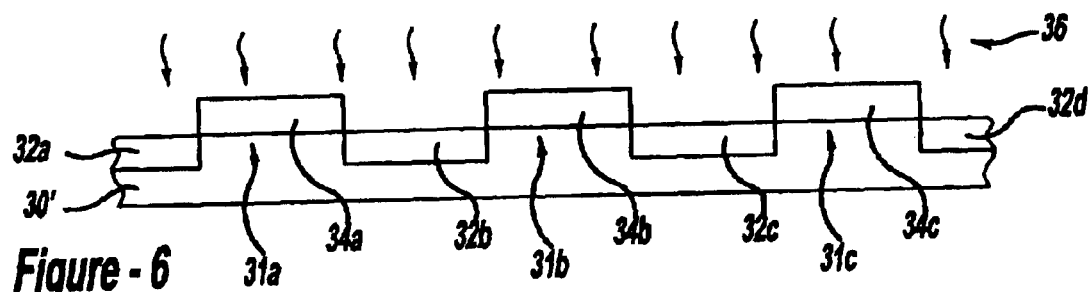
FIG. 6, FIG. 7, FIG. 8, FIG. 9 and FIG. 10 show a series of schematic cross-sectional diagrams illustrating the results of progressive stages in forming within a semiconductor integrated circuit microelectronic fabrication, and in accord with a preferred embodiment of the present invention, a series of gate dielectric layers.

Shown in FIG. 6 is a schematic cross-sectional diagram of the semiconductor integrated circuit microelectronic fabrication at an early stage in its fabrication in accord with the preferred embodiment of the present invention.

Shown in FIG. 6 is a schematic cross-sectional diagram of a semiconductor integrated circuit microelectronic fabrication analogous to the semiconductor integrated circuit microelectronic fabrication whose schematic cross-sectional diagram is illustrated in FIG. 1. The semiconductor integrated circuit microelectronic fabrication comprises a once thermally oxidized semiconductor substrate 30' having formed therein a series of isolation regions 32a, 32b, 32c and 32d which define a series of active regions 31a, 31b and 31c of the once thermally oxidized semiconductor substrate 30'. Incident to thermally annealing the once thermally oxidized semiconductor substrate 30' within a first thermal oxidizing environment 36, there is formed upon the series of active regions 31a, 31b and 31c of the once thermally oxidized semiconductor substrate 30' the series of first gate oxide layers 34a, 34b and 34c.

Figure 7:
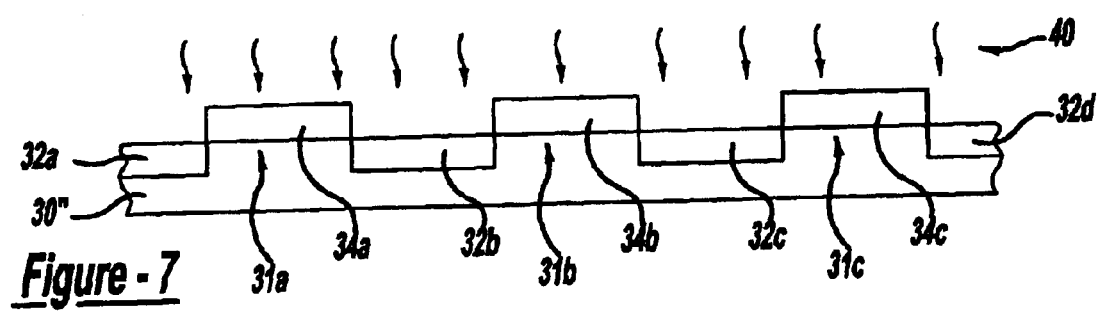

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein the semiconductor integrated circuit microelectronic fabrication has been additionally thermally annealed within a compensating thermal annealing environment 40 to form from the once thermally oxidized semiconductor substrate 30' a thermally compensated once thermally oxidized semiconductor substrate 30" otherwise generally equivalent to the twice thermally oxidized semiconductor substrate 10" as illustrated within the schematic cross-sectional diagram of FIG. 3. Within the preferred embodiment of the present invention, however, there is preferably not stripped the pair of first gate oxide layers 34b and 34c prior to thermally annealing the once thermally oxidized semiconductor substrate 30' within the compensating thermal annealing environment 40.

The compensating thermal annealing environment 40 may comprise purely a thermal annealing environment (i.e., an unreactive environment) or in an alternative (and preferably) may comprise an oxidizing thermal annealing environment in accord with the second thermal oxidizing environment 20 as illustrated within the schematic cross-sectional diagram of FIG. 3. Within the preferred embodiment of the present invention, the compensating thermal annealing environment 40 is intended to provide a compensating thermal exposure to the semiconductor integrated circuit microelectronic fabrication whose schematic cross-sectional diagram is illustrated in FIG. 7 without forming any independent gate oxide layers therein.

Figure 8:
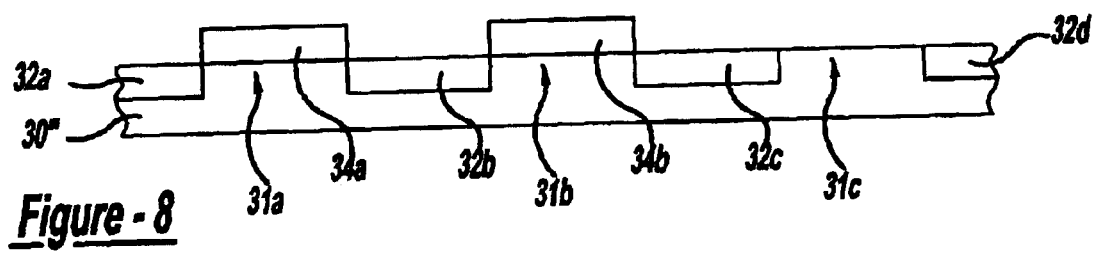

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein the first gate oxide layer 34c has been stripped from the active region 31c of the thermally compensated once thermally oxidized semiconductor substrate 10".

The first gate oxide layer 34c may be stripped from the active region 31c of the thermally compensated once thermally oxidized semiconductor substrate 10" as illustrated within the semiconductor integrated circuit microelectronic fabrication whose schematic cross-sectional diagram is illustrated in FIG. 7 to provide the semiconductor integrated circuit microelectronic fabrication whose schematic cross-sectional diagram is illustrated in FIG. 8 while employing methods and materials as are conventional in the art of semiconductor integrated circuit microelectronic fabrication.

Figure 9:
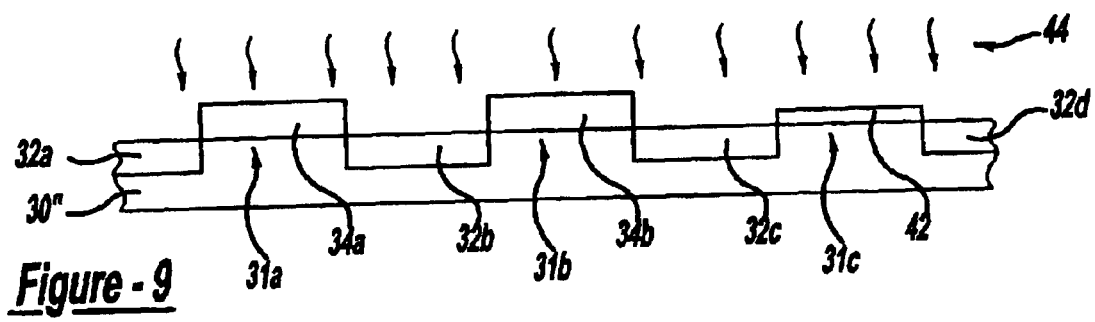

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein there has been formed upon the active region 31c of a thermally compensated twice thermally oxidized semiconductor substrate 30''' a second gate oxide layer 42 through annealing the thermally compensated once thermally oxidized semiconductor substrate 30" as illustrated within the schematic cross-sectional diagram of FIG. 8 within a second thermal oxidizing environment 44.

Within the preferred embodiment of the present invention, the second thermal oxidizing environment 44 corresponds with the third thermal oxidizing environment 24 as illustrated within the schematic cross-sectional diagram of FIG. 5.

Figure 10:
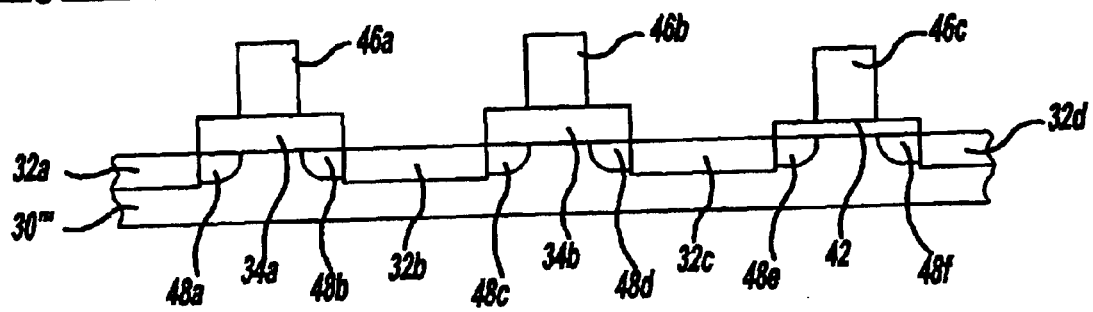

Referring now to FIG. 10, there is shown a schematic cross-sectional diagram illustrating the results of further processing of the semiconductor integrated circuit microelectronic fabrication whose schematic cross-sectional diagram is illustrated in FIG. 9.

Shown in FIG. 10 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 9, but wherein there is formed upon the pair of first gate oxide layers 34a and 34b and the second gate oxide layer 42a corresponding series of gate electrodes 46a, 46b and 46c. The series of gate electrodes 46a, 46b and 46c may be formed employing methods and materials as are conventional in the art of microelectronic fabrication. Similarly, there is also shown within the schematic cross-sectional diagram of FIG. 10, and formed within the active regions 31a, 31b and 31c of the thermally compensated twice thermally annealed semiconductor substrate 30''' and separated by the gate electrodes 46a, 46b and 46c a series of source/drain regions 48a, 48b, 48c, 48d, 48e and 48f, which may also be formed employing methods and materials as are conventional in the art of semiconductor integrated circuit microelectronic fabrication.

Upon forming the semiconductor integrated circuit microelectronic fabrication whose schematic cross-sectional diagram is illustrate in FIG. 10, there is provided by the present invention a semiconductor integrated circuit microelectronic fabrication in accord with the preferred embodiment of the present invention. The semiconductor integrated circuit microelectronic fabrication has formed therein devices with gate oxide layers of differing thicknesses of less than a maximum number of differing thicknesses, and with predictable and uniform properties. The foregoing result is realized by providing a compensating thermal annealing treatment to the semiconductor integrated circuit microelectronic fabrication incident to its fabrication. While the compensating thermal treatment is illustrated interposed between forming various gate oxide layers, it may also be provided prior to forming the various gate oxide layers or after forming the various gate oxide layers.

As is understood by a person skilled in the art, the preferred embodiment of the present invention is illustrative of the present invention rather than limiting of the present invention. Revisions and modifications may be undertaken with respect to a semiconductor integrated circuit microelectronic fabrication in accord with the preferred embodiment of the present invention, while still fabricating a semiconductor integrated circuit microelectronic fabrication in accord with the present invention, further in accord with the accompanying claims.

What is claimed is:

1. A method for fabricating a semiconductor substrate comprising:

defining a sequential and repetitive thermal oxidation and partial stripping method for forming upon a semiconductor substrate a plurality of gate dielectric layers having a maximum numbered plurality of differing thicknesses formed employing a corresponding maximum numbered plurality of thermal oxidation process steps;

sequentially and repetitively thermally oxidizing and partially stripping the semiconductor substrate to form thereupon the plurality of gate dielectric layers having less than the maximum numbered plurality of differing thicknesses formed employing less than the corresponding maximum numbered plurality of thermal oxidation process steps; and supplementally thermally annealing the semiconductor substrate to compensate for forming thereupon the plurality of gate dielectric layers having less than the corresponding maximum numbered plurality of differing thicknesses formed employing less than the corresponding maximum numbered plurality of thermal oxidation process steps.

2. The method of claim 1 wherein the maximum numbered plurality is at least three.

3. The method of claim 1 wherein the maximum numbered plurality is greater than three.

4. The method of claim 1 wherein the plurality of differing thicknesses encompass a range including a low thickness of from about 10 to about 40 angstroms and a high thickness of from about 50 to about 200 angstroms.

5. The method of claim 1 wherein the supplemental thermal annealing is undertaken prior to forming the plurality of gate dielectric layers upon the semiconductor substrate.

6. The method of claim 1 wherein the supplemental thermal annealing is undertaken interposed between forming the plurality of gate dielectric layers upon the semiconductor substrate.

7. The method of claim 1 wherein the supplemental thermal annealing is undertaken subsequent to forming the plurality of gate dielectric layers upon the semiconductor substrate.

8. A method for fabricating a semiconductor substrate comprising:

defining a sequential and repetitive thermal oxidation and partial stripping method for forming upon a semiconductor substrate a plurality of gate dielectric layers having three differing thicknesses formed employing three thermal oxidation process steps;

sequentially and repetitively thermally oxidizing and partially stripping the semiconductor substrate to form thereupon the plurality of gate dielectric layers having less than the three differing thicknesses formed employing less than the three thermal oxidation process steps; and supplementally thermally annealing the semiconductor substrate to compensate for forming thereupon the plurality of gate dielectric layers having the less than three differing thicknesses formed employing the less than three thermal oxidation process steps.

9. The method of claim 8 wherein the plurality of differing thicknesses encompass a range including a low thickness of from about 10 to about 40 angstroms and a high thickness of from about 50 to about 200 angstroms.

10. The method of claim 8 wherein the supplemental thermal annealing is undertaken prior to forming the plurality of gate dielectric layers upon the semiconductor substrate.

11. The method of claim 8 wherein the supplemental thermal annealing is undertaken interposed between forming the plurality of gate dielectric layers upon the semiconductor substrate.

12. The method of claim 8 wherein the supplemental thermal annealing is undertaken subsequent to forming the plurality of gate dielectric layers upon the semiconductor substrate.

13. A method for fabricating a semiconductor substrate comprising:

defining a sequential and repetitive thermal oxidation and partial stripping method for forming upon a semiconductor substrate a plurality of gate dielectric layers having a maximum numbered plurality of differing thicknesses formed employing a corresponding maximum numbered plurality of thermal oxidation process steps;

sequentially and repetitively thermally oxidizing and partially stripping the semiconductor substrate to form thereupon the plurality of gate dielectric layers having less than the maximum numbered plurality of differing thicknesses formed employing less than the corresponding maximum numbered plurality of thermal oxidation process steps; and supplementally thermally annealing the semiconductor substrate without forming a gate dielectric layer thereupon to compensate for forming thereupon the plurality of gate dielectric layers having less than the corresponding maximum numbered plurality of differing thicknesses formed employing less than the corresponding maximum numbered plurality of thermal oxidation process steps.

14. The method of claim 13 wherein the maximum numbered plurality is at least three.

15. The method of claim 13 wherein the maximum numbered plurality is greater than three.

16. The method of claim 13 wherein the plurality of differing thicknesses encompass a range including a low thickness of from about 10 to about 40 angstroms and a high thickness of from about 50 to about 200 angstroms.

17. The method of claim 13 wherein the supplemental thermal annealing is undertaken prior to forming the plurality of gate dielectric layers upon the semiconductor substrate.

18. The method of claim 13 wherein the supplemental thermal annealing is undertaken interposed between forming the plurality of gate dielectric layers upon the semiconductor substrate.

19. The method of claim 13 wherein the supplemental thermal annealing is undertaken subsequent to forming the plurality of gate dielectric layers upon the semiconductor substrate.

* * * * *